US006955726B2

(12) United States Patent
Kang et al.

(10) Patent No.: US 6,955,726 B2
(45) Date of Patent: *Oct. 18, 2005

(54) MASK AND MASK FRAME ASSEMBLY FOR EVAPORATION

(75) Inventors: Chang Ho Kang, Yangsan (KR); Tae Seung Kim, Busan (KR)

(73) Assignee: Samsung SDI Co., Ltd., Suwon-si (KR)

( * ) Notice: Subject to any disclaimer, the term of this patent is extended or adjusted under 35 U.S.C. 154(b) by 260 days.

This patent is subject to a terminal disclaimer.

(21) Appl. No.: 10/452,382

(22) Filed: Jun. 3, 2003

(65) Prior Publication Data

US 2003/0221614 A1 Dec. 4, 2003

(30) Foreign Application Priority Data

Jun. 3, 2002 (KR) ............... 10-2002-0031060
May 19, 2003 (KR) ............... 10-2003-0031537

(51) Int. Cl.$^7$ .......... C23C 16/00; C23C 14/00; C25B 11/00; H01L 21/425; B44C 1/22
(52) U.S. Cl. .......... 118/720; 118/504; 118/721; 118/505; 204/298.11; 438/531; 438/551; 438/552; 438/553; 438/671; 438/717; 216/12; 216/41; 216/45; 216/47; 216/48; 216/49; 216/50
(58) Field of Search .......... 118/720, 721, 728, 118/300, 301, 500, 504, 505; 156/345.14, 156/345.19, 345.23, 345.3, 345.51; 279/43.8; 204/298.11; 216/12, 41, 45–50; 438/531, 438/551–553

(56) References Cited

U.S. PATENT DOCUMENTS

| 4,167,413 | A | * | 9/1979 | Christ et al. ............... 156/293 |
| 4,511,599 | A | * | 4/1985 | Rustomji .................... 427/66 |
| 4,615,781 | A | * | 10/1986 | Boudreau .................. 427/96.8 |
| 4,715,940 | A | * | 12/1987 | Boudreau .................... 427/585 |
| 4,780,382 | A | * | 10/1988 | Stengl et al. ................. 430/5 |
| 5,260,151 | A | * | 11/1993 | Berger et al. ................. 430/5 |
| 5,567,267 | A | * | 10/1996 | Kazama et al. ........ 156/345.27 |
| 6,177,218 | B1 | * | 1/2001 | Felker et al. ................. 430/30 |
| 6,475,287 | B1 | * | 11/2002 | Clark ......................... 118/721 |
| 6,749,690 | B2 | * | 6/2004 | Clark ......................... 118/721 |
| 6,858,086 | B2 | * | 2/2005 | Kang ......................... 118/270 |
| 2003/0101932 | A1 | * | 6/2003 | Kang ......................... 118/504 |
| 2003/0221613 | A1 | * | 12/2003 | Kang et al. ................. 118/504 |
| 2004/0104197 | A1 | * | 6/2004 | Shigemura et al. ........... 216/20 |
| 2004/0115342 | A1 | * | 6/2004 | Shigemura .................. 427/143 |
| 2004/0123799 | A1 | * | 7/2004 | Clark ......................... 118/504 |

FOREIGN PATENT DOCUMENTS

| KR | 1998-71583 | 10/1998 |
| KR | 2000-60589 | 10/2000 |

* cited by examiner

Primary Examiner—Rudy Zervigon
(74) Attorney, Agent, or Firm—Stein, McEwen & Bui, LLP

(57) ABSTRACT

A mask frame assembly includes a frame having an opening and a mask having at least two unit mask elements. Both ends of each unit mask element are fixed to the frame in a state of tension. The unit mask elements include a unit masking pattern, and overlap each other on a predetermined width to form a single mask pattern block. Each unit mask element has a recessed wall in an overlapping portion thereof so as to maintain the thickness of the mask constant at an overlap between the unit mask elements. Accordingly, the mask frame assembly reduces distortion in an evaporation pattern due to an increase in the size of a mask pattern, facilitates the adjustment of a total pitch of evaporation patterns, and prevents evaporation from occurring at undesired positions.

23 Claims, 12 Drawing Sheets

MASK AND MASK FRAME ASSEMBLY FOR EVAPORATION

CROSS-REFERENCE TO RELATED APPLICATIONS

This application claims the benefit of Korean Patent Application Nos. 2002-31060, filed on Jun. 3, 2002, and 2003-31537, filed on May 19, 2003, in the Korean Intellectual Property Office, the disclosures of which are incorporated herein by reference.

BACKGROUND OF THE INVENTION

1. Field of the Invention

The present invention relates to a metal mask, and more particularly, to a mask and a mask frame assembly to vacuum evaporate a thin layer for an organic electroluminescent device.

2. Description of the Related Art

In general, electroluminescent devices are active luminescent display devices. Electroluminescent devices have been noted as the next generation display devices because they have a wide viewing angle, high contrast, and high response speed.

Electroluminescent devices are divided into inorganic electroluminescent devices and organic electroluminescent devices according to a material of a luminescent layer. Organic electroluminescent devices have a higher luminance and response speed than that of inorganic electroluminescent devices and are capable of displaying color images.

Generally, conventional organic electroluminescent devices comprise a first electrode which is formed on a transparent insulation substrate, in a predetermined pattern, an organic luminescent layer which is formed on the insulation substrate having the first electrode through a vacuum evaporation, and a second electrode, i.e., a cathode electrode, which is formed on a top surface of the organic luminescent layer to cross the first electrode.

Typically, the first electrode is made of indium tin oxide (ITO), which is patterned by being wet etched using an etchant containing ferric chloride, according to a photolithographic method. However, where the second electrode, i.e., the cathode electrode, is etched using the photolithographic method, and where a resist is lifted and the second electrode is etched, moisture permeates through the interface between the organic luminescent layer and the second electrode. The permeation of moisture remarkably decreases the life span and performance of the organic electroluminescent device.

To overcome this problem, methods of evaporating an organic electroluminescent material for an organic luminescent layer and a material for a second electrode have been proposed. In manufacturing organic electroluminescent devices using these evaporation methods, a first electrode is formed of, for example, ITO, on a transparent insulation substrate in a stripped pattern using, for example, a photolithographic method. Next, an organic luminescent layer is stacked on the transparent insulation substrate having the first electrode. Thereafter, a mask having the same pattern as a second electrode is placed on the organic luminescent layer, and a material for the second electrode is evaporated to form the second electrode.

A mask which is used to form an organic luminescent layer or a second electrode, i.e., a cathode electrode, through an evaporation method, an organic electroluminescent device manufactured using the mask, and a manufacturing method thereof are disclosed in Korean Patent Publication No. 2000-60589. The mask is structured to have slots formed in a main body of a thin plate, the slots being spaced apart by a predetermined distance in a stripped pattern.

A mask including slits and bridges forming a mesh in a thin metal plate is disclosed in Korean Patent Publication No. 1998-71583.

A mask including an electrode mask portion and a pair of terminal mask portions is disclosed in Japanese Patent Publication No. 2000-12238. The electrode mask portion includes marking portions which have a width corresponding to a gap between second electrodes and are parallel with each other in a stripped pattern, and connection portions which connect both ends of each marking portion.

As described above, in the conventional masks, slit-shaped holes are formed in a thin metal plate in a stripped pattern. Accordingly, although the thin metal plate is supported by a frame at its edge so that tension is applied to the frame, the mask sags due to slots formed in the mask. Therefore, the conventional masks do not closely contact a substrate. This problem becomes more critical as the size of the substrate increases. In addition, during evaporation, the mask expands due to heat, which increases the degree of sagging.

FIG. 1 shows an example of a conventional mask for mass production of electroluminescent devices. The mask 10 comprises a single thin metal plate 11 having a plurality of unit mask patterns 12 so as to form a plurality of organic electroluminescent devices through evaporation, at one time. The mask 10 is fixed to and supported by a frame 20 such that a tension is applied to the mask 10.

Since the mask 10 used to mass produce the electroluminescent devices is large, sagging of the mask 10 is prevalent even though the mask 10 is supported by the frame 20 with uniform tension. In addition, it is necessary to weld the mask 10 to the frame 20 so as to maintain the width of each slot 12a formed in the unit mask patterns 12 within a predetermined tolerance range. Here, where the tension is uniformly distributed in the mask 10 to prevent the mask 10 from sagging, distortion often occurs in the pitch of the slots 12a in the masking patterns 12, making it difficult to maintain the predetermined tolerance range. In particular, where a slot in a unit mask pattern 12 at a particular position in the mask 10 is deformed, all slots adjacent to the deformed slot are also deformed, so the slots move relative to a substrate and go beyond the predetermined tolerance range. This phenomenon becomes more accentuated in a tangential direction of each slot (an orthogonal direction to the lengthwise direction of each slot).

For example, where the unit mask patterns 12 are distorted, a total pitch becomes large, so red, blue, and green organic layers cannot be formed with precision, on individual unit electrode patterns on a substrate. Since the adjustment of the pitch of each unit mask pattern 12 and the total pitch is extremely restricted, there is a limit in increasing the size of the mask 10.

FIG. 2 shows a conventional mask 10 that is fixed to a frame 20 using tension that acts at each side of the mask 10. As shown by dashed lines of FIG. 2, support bars 21 at the right and left sides of the frame 20 are curved inward due to the tension of the mask 10, and support bars 22 at the upper and lower sides of the frame 20 are curved outward. In another case, FIG. 3 illustrates that support bars 21 at right and left sides of a frame 20 are curved outward, and support bars 22 at upper and lower sides of the frame 20 are curved inward.

Accordingly, even where the mask 10 is welded to the frame 20 with uniform tension, it is difficult to adjust the total pitch to correct the deformation of unit mask patterns and a difference between a unit electrode pattern and a unit mask pattern.

A mask reported to overcome a problem associated with creep in strips that define slots, due to a thermal expansion of the mask, is disclosed in Japanese Patent Publication No. 2001-247961. The mask is used to form a patterning layer on a substrate through evaporation and is composed of a mask portion, in which a plurality of first openings are separated by barriers, and a screen portion, in which a plurality of second openings having a smaller opening area than the first openings are disposed directly above each first opening.

A structure of a magnetic mask is disclosed in Japanese Patent Publication No. 2001-273979. An evaporation mask-frame which includes a mask pattern corresponding to an evaporation area and which is closely adhered to a substrate on which evaporation is to be performed, so as to mask the evaporation area, is disclosed in Japanese Patent Publication No. 2001-254169. The mask pattern includes a fine pattern unit having fine gaps, which are difficult to manufacture accurately. The fine pattern unit is supported by a fine rib.

These conventional masks are made of a magnetic material so as to allow the masks to be closely adhered to a substrate. However, a pitch between strips changes due to the weight and the tension of a mask, and a total pitch also changes due to the internal stress of a mask and a frame.

A mask to prevent thermal deformation of an opening and to increase the accuracy thereof is disclosed in Japanese Patent Publication No. 2002-235165 and U.S. Pat. No. 3,241,519. A frame and a mask, on which a plurality of unit patterns are formed for a pattern of a large display, are disclosed in EP Publication No. 1,209,522 A2. Similar masks to that are described above are also disclosed in U.S. patent application Ser. No. 2002/0025406 A1. However, these masks do not solve some or all of the above-described problems.

A mask frame assembly having a plurality of masks which are supported by a single frame, in which an opening corresponding to each mask is formed, is disclosed in EP Publication No. 1,229144 A2. However, there is a limit in narrowing a distance between masks. Accordingly, a substrate, on which evaporation is performed, is wastefully used. Moreover, assembling the masks together is complicated, and the mask frame assembly cannot be used to form a pattern of a large display.

SUMMARY OF THE INVENTION

Accordingly, it is an aspect of the present invention to provide a mask and a mask frame assembly for thin layer vacuum evaporation for an organic electroluminescent device, the mask frame assembly which reduces distortion in an evaporation pattern due to an increase in the size of a mask pattern and facilitates the adjustment of a total pitch of evaporation patterns.

Another aspect of the present invention is to provide a mask and a mask frame assembly for thin layer vacuum evaporation for an organic electroluminescent device, the mask frame assembly which allows for a large single masking pattern by preventing an organic substance or an aluminum forming an electrode, from being evaporated at an undesired position through a gap between unit mask elements, and minimizes a change in a total pitch due to external forces applied to the mask and a frame or due to the internal stress of the mask and the frame.

Yet another aspect of the present invention is to provide a mask and a mask frame assembly for thin layer vacuum evaporation for an organic electroluminescent device, the mask frame assembly reducing a howling phenomenon generated due to an external impact on a large single masking pattern.

Additional aspects and/or advantages of the invention will be set forth in part in the description which follows and, in part, will be obvious from the description, or may be learned by practice of the invention.

To achieve the above and/or other aspects of the present invention, there is provided a mask frame assembly for evaporation, comprising a frame and a mask which comprises at least two unit mask elements whose both ends are fixed to the frame. The unit mask elements overlap each other by a predetermined distance and each of the unit mask elements includes a recessed wall in an overlapping portion thereof so as to maintain a constant thickness at the overlap between the unit mask elements. At least one of the unit mask elements includes a unit masking pattern.

The recessed wall of each unit mask element may be formed to have a predetermined width, using a half-etching method, along a lengthwise direction of the each mask element. The recessed wall may be formed to slant, curve or to be stepped.

The width of the recessed wall may be the same or greater than the width of the overlap between the unit mask elements. The width of the recessed wall may be in a range of 30–100 $\mu$m. The width of the overlap between the unit mask elements may be in a range of 10–70 $\mu$m.

One or more unit masking patterns included in the corresponding one or more unit mask elements may form a single masking pattern block, or the unit masking pattern included in a corresponding one of the unit mask elements may form an independent masking pattern block.

The mask frame assembly may be used for a thin layer vacuum evaporation for an organic electroluminescent device. The frame of the mask assembly may have an opening to accommodate the unit mask elements.

To achieve the above and/or other aspects of the present invention, there is provided another mask frame assembly for evaporation, comprising a frame and a mask which comprises at least two unit mask elements whose both ends are fixed to the frame, and at least one sheet element. The unit mask elements are separated from each other by a predetermined gap and the sheet element blocks the gap between the adjacent unit mask elements. At least one of the unit mask elements includes a unit masking pattern.

The sheet element may have both end portions thereof bonded and fixed to the frame.

The sheet element may have a width which is greater than the gap between the adjacent unit mask elements and less than a distance between adjacent unit masking patterns respectively included in the adjacent unit mask elements.

One or more unit masking patterns included in the corresponding one or more unit mask elements may form a single masking pattern block, or the unit masking pattern included in a corresponding one of the unit mask elements may form an independent masking pattern block.

To achieve the above and/or other aspects of the present invention, there is provided a mask for evaporation, comprising a first unit mask element having a first recessed wall, and a second unit mask element having a second recessed wall that overlaps the first recessed wall so as to maintain a constant surface profile of the mask.

To achieve the above and/or other aspects of the present invention, there is provided another mask for evaporation, comprising at least two unit mask elements, and at least one sheet element which blocks a gap formed between the adjacent unit mask elements, wherein the mask is divided into the unit mask elements so as to prevent a pattern distortion.

BRIEF DESCRIPTION OF THE DRAWINGS

These and/or other aspects and advantages of the present invention will become apparent and more readily appreciated from the following description of the preferred embodiments taken in conjunction with the accompanying drawings in which.

DETAILED DESCRIPTION OF THE PREFERRED EMBODIMENTS

Figure 1:
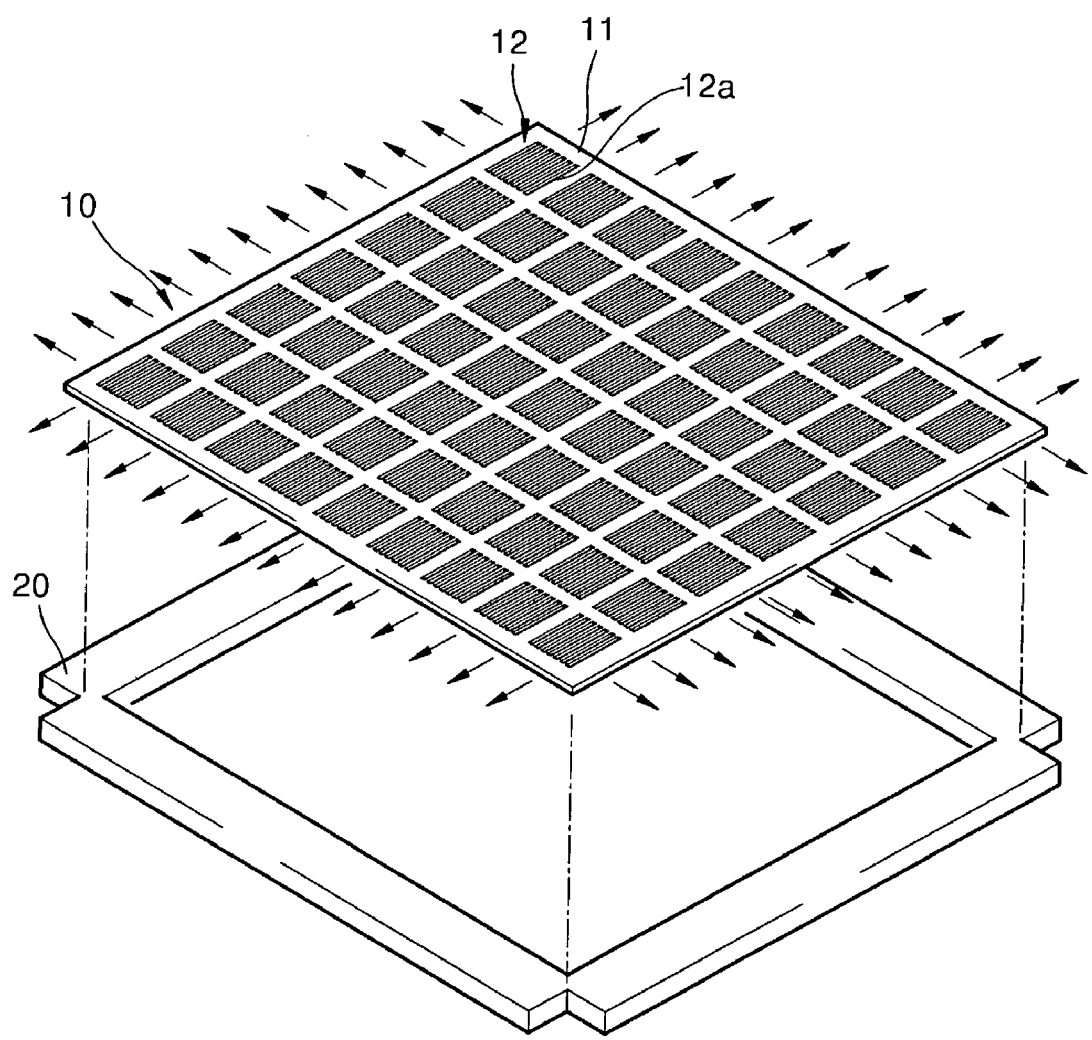
FIG. 1 is an exploded perspective view of a conventional mask frame assembly for a thin layer vacuum evaporation for an organic electroluminescent device.
Figure 2:
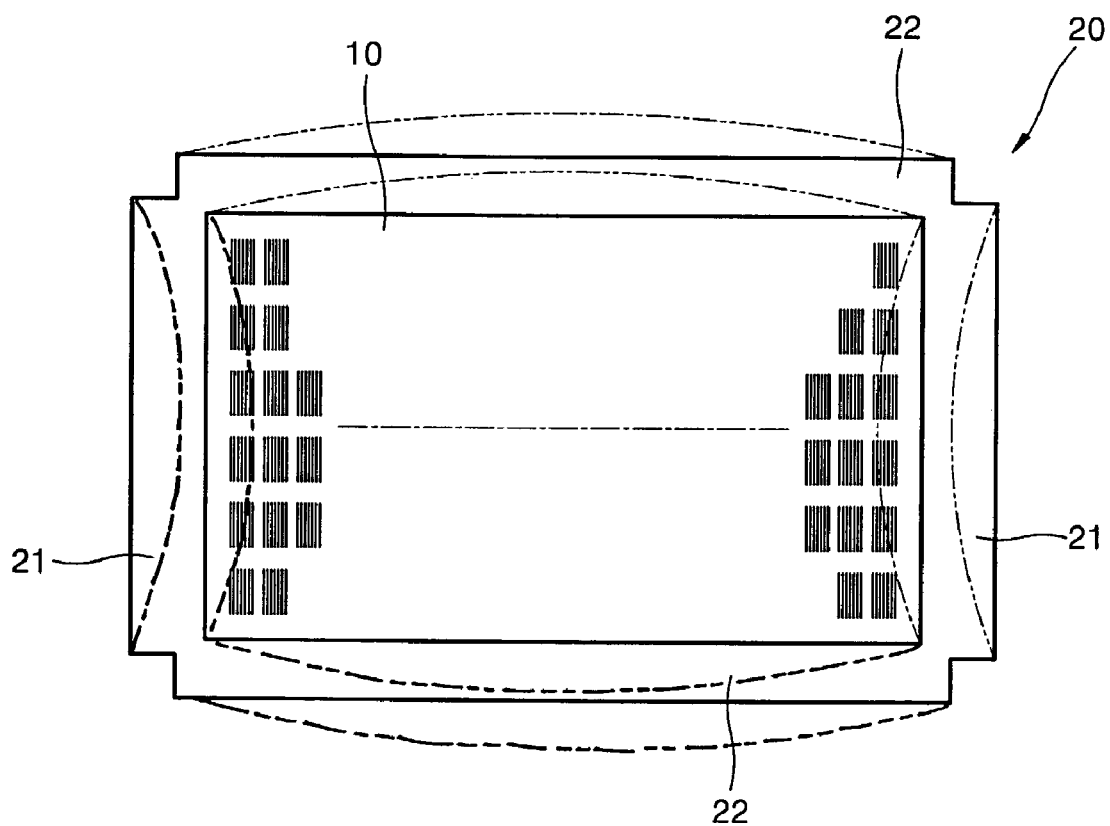
FIGS. 2 and 3 are plane views of a conventional mask frame assembly.
Figure 3:
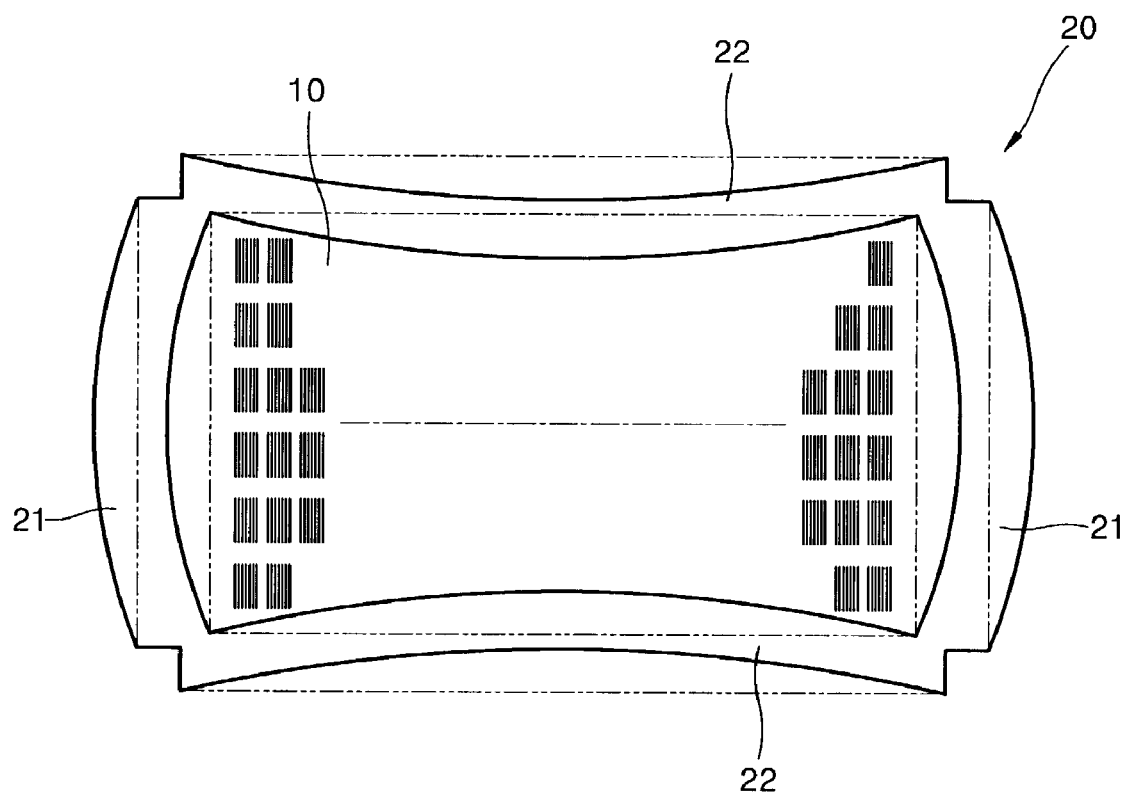

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Figure 4:
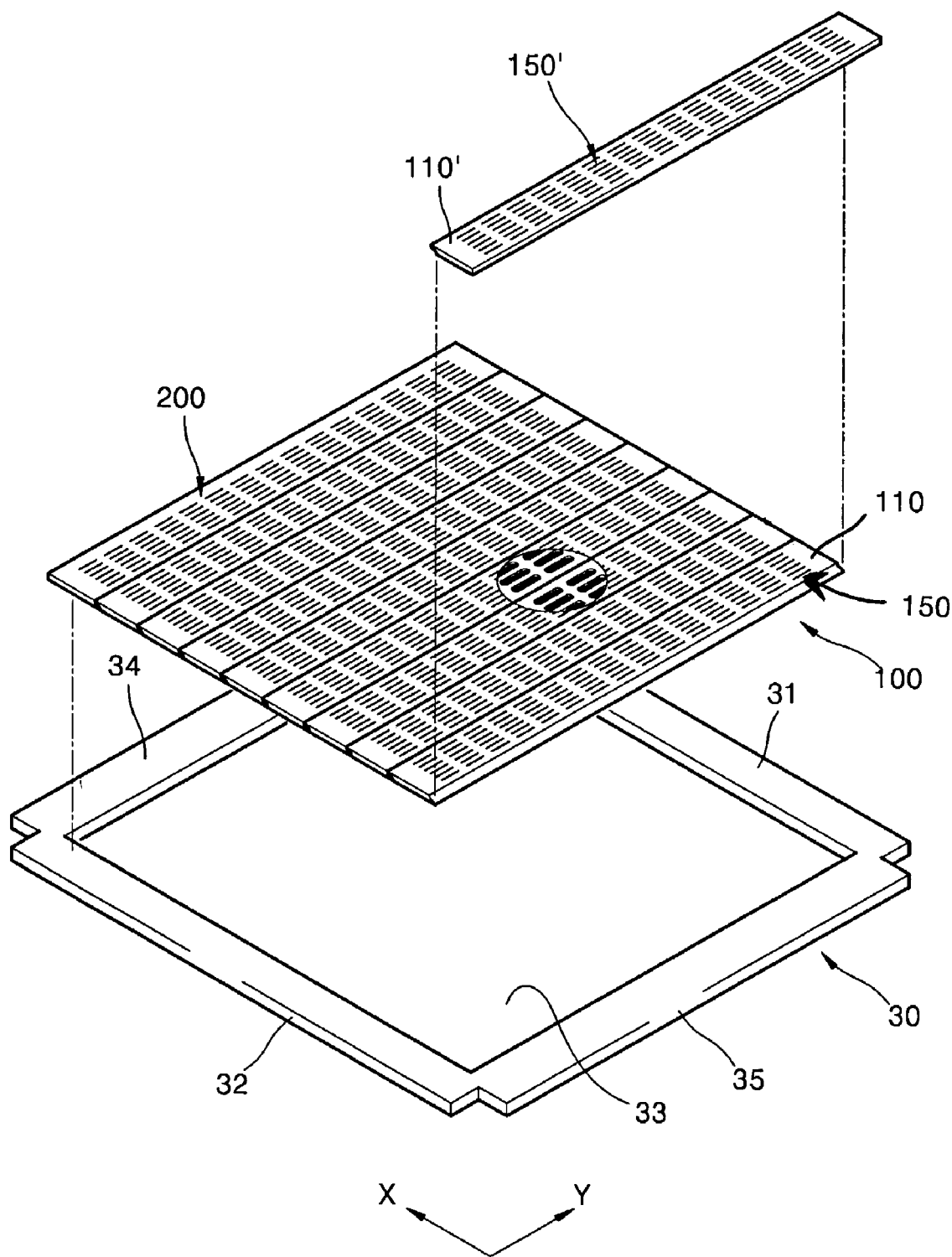
FIG. 4 is an exploded perspective view of a mask frame assembly for a thin layer vacuum evaporation for an organic electroluminescent device according to an embodiment of the present invention.

FIG. 4 shows a mask and a mask frame assembly for a thin layer vacuum evaporation for an organic electroluminescent device, according to an embodiment of the present invention. The mask frame assembly includes a frame 30 and a mask 100. The mask 100 includes unit mask elements 110 and 110' both ends of which are supported by the frame 30 in a state of tension. For example, tension is applied to the unit mask elements 110 and 110', and thereafter, the unit mask elements 110 and 110' are fixed to the frame 30 while remaining under tension. The unit mask elements 110 and 110' partially overlap each other. The frame 30 includes first support portions 31 and 32 disposed in parallel and second support portions 33 and 35 whose ends are connected to corresponding ends of the first support portions 31 and 32, thereby forming a quadrilateral opening 33. The second support portions 34 and 35 are disposed parallel to the unit mask elements 110 and 110' and may be made of an elastic material. It is understood that the first and second support portions 31, 32, 34, and 35 may be integrally formed.

Any type of frame that is sufficiently rigid to apply a desired tension to the unit mask elements 110 and 110' and has a structure that prevents an interference between a substrate, on which evaporation is to be performed, and the mask 100, where the mask 100 is closely attached to the substrate, can be used as the frame 30.

The mask 100 comprises a plurality of unit mask elements 110 and 110' whose both ends are supported by the frame 30 in a state of tension. The unit mask elements 110 and 110' include unit masking patterns 150 and 150', respectively. The unit mask elements 110 and 110' partially overlap at their edges to constitute a single masking pattern block 200 larger than a unit mask element 110 or 110'.

Figure 5:
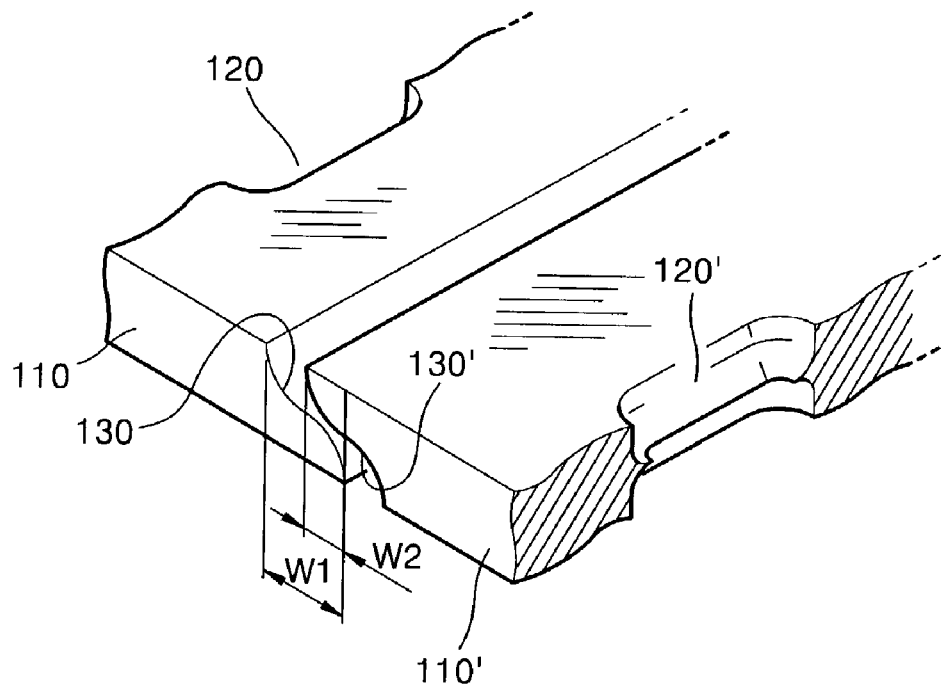
FIG. 5 is a partial perspective view of an example of a recessed wall of a unit mask element according to present invention.

As shown in FIGS. 4 and 5, each unit mask element 110 or 110' is formed of a thin plate with a strip shape. The unit masking patterns 150 or 150' are formed in each unit mask element 110 or 110' at predetermined intervals in a lengthwise direction of the unit mask element 110 or 110'. The unit mask elements 110 and 110' are not restricted to the strip shape. As shown in FIG. 5, each unit masking pattern 150 or 150' includes dots or slits 120 or 120'. It is understood that arrangement, structure and/or features of the unit masking patterns 150 and 150' may be changed to accommodate a pattern to be formed through evaporation.

Figure 6:
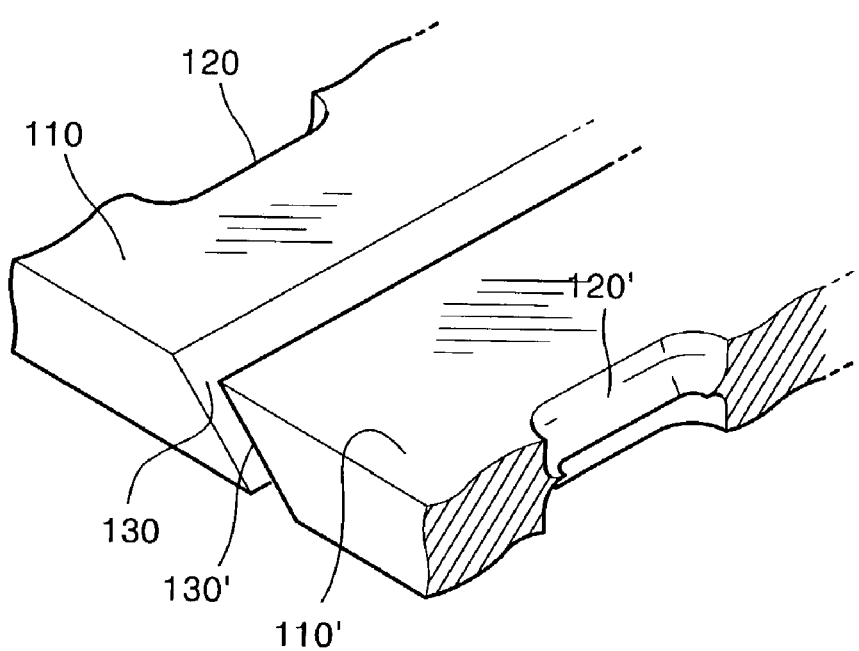
FIGS. 6 and 7 are partial perspective views of other examples of the recessed wall of the unit mask element according to present invention.
Figure 7:
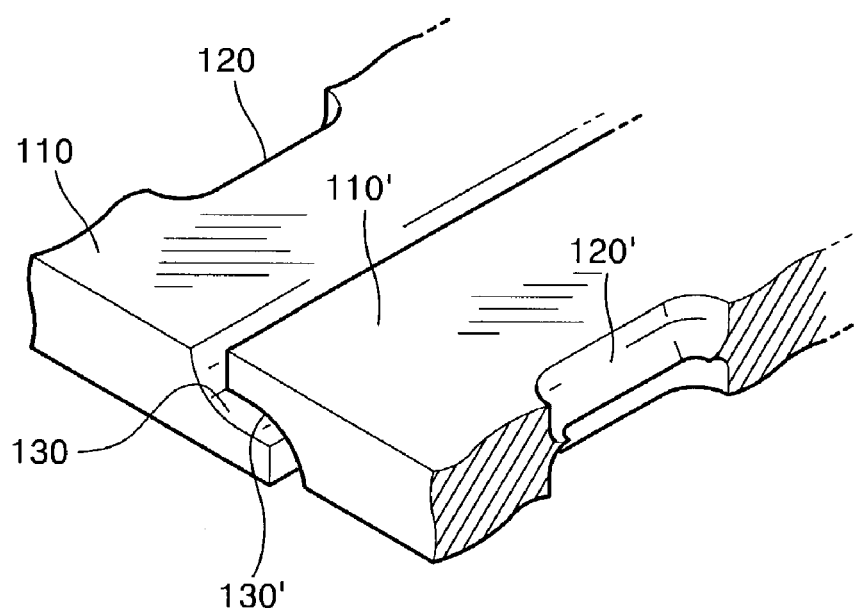

Recessed walls 130 and 130' are formed in the respective unit mask elements 110 and 110' in a lengthwise direction so as to have a thickness of an overlap portion between the unit mask elements 110 and 110' be the same as the thickness of the unit mask elements 110 and 110'. As shown in FIG. 5, the recessed walls 130 and 130' may be formed to slant in a complex curved profile. However, as shown in FIG. 6, recessed walls 130 and 130' may be formed to slant in a straight profile. Still in another example, as shown in FIG. 7, recessed walls 130 and 130' may be formed to be slanted in symmetric simple curved profiles.

For example, the recessed walls 130 and 130' can be formed through a half-etching so as to have a thickness of about half of the unit mask elements 110 and 110'. In addition, the recessed walls 130 and 130' of the adjacent unit mask elements 110 and 110' may have symmetric shapes so as to have the thickness of an overlap between the adjacent unit mask elements 110 and 110' be the same as the thickness of each unit mask element 110 or 110', as shown in FIGS. 5 through 7.

As illustrated in FIG. 5, a width W1 of the recessed walls 130 and 130' may be in a range of 30–100 $\mu$m. The width W1 of the recessed walls 130 and 130' can be adjusted to take into account shapes of slots 120 and 120' in the unit masking patterns 150 and 150', a pitch between the slots 120, and a pitch between the slots 120'. The width W1 may be 50 $\mu$m. A width W2 of an overlap between the adjacent unit mask elements 110 and 110' may be in a range of 10–70 $\mu$m. The width W2 of the overlap can be appropriately adjusted to take into account a thermal expansion of the unit mask elements 110 and 110', tension applied to the unit mask elements 110 and 110', and a total pitch of the mask pattern block 200.

Figure 8:
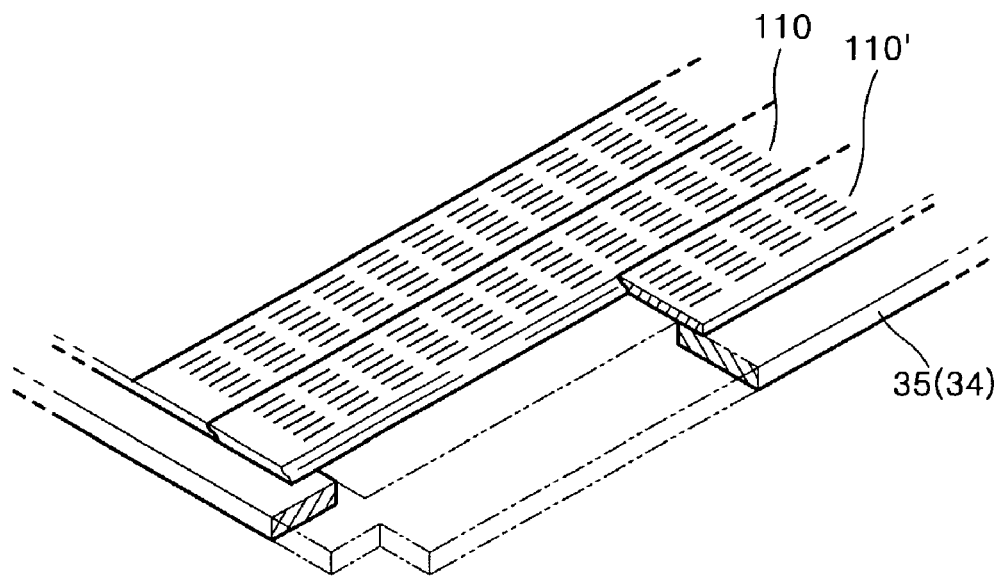
FIG. 8 is a perspective view of a part of the mask frame assembly shown in FIG. 4, a part of which is cut away.

Referring to FIG. 4, both ends of the unit mask elements 110 and 110' are fixed to the respective first support portions 31 and 32 of the frame 30 with tension. The fixation of the unit mask elements 110 and 110' to the frame 30 can be performed using a spot welding, a seam welding, or a YAG laser welding, as well as other joining methods known or to be known. As shown in FIG. 8, a unit mask element 110' positioned at an edge of the mask 100 can be welded to the second support portion 35 or 34 along its side edge.

As described above, the mask 100 comprises the unit mask elements 110 and 110' having unit masking patterns 150 and 150', respectively, so as to prevent deformation and pattern distortion due to a thermal expansion during evaporation. In other words, since the unit mask elements 110 and 110' are fixed to the frame 30 with tension acting in a Y direction in FIG. 4, uniform tension is applied throughout the mask 100, and concentration of deformation can be prevented.

In addition, according to the present invention, since the unit mask elements 110 and 110' partially overlap each other, evaporation is prevented from occurring in a gap between the unit mask elements 110 and 110'. As a result, the unit masking patterns 150 and 150' may act as the large single masking pattern block 200 to manufacture a large display.

Moreover, since the recessed walls 130 and 130' are respectively formed in overlapping portions of the unit mask elements 110 and 110', as shown in FIGS. 5 through 7, the overlap between the unit mask elements 110 and 110' can be prevented from becoming thicker than the unit mask elements 110 and 110'. Accordingly, the single masking pattern block 200 is prevented from being distorted. In particular, where the width W1 of the recessed walls 130 and 130' is 50 μm and the width W2 of the overlap is 30 μm, since the widths W1 and W2 are within the range of a pitch between organic patterns of an organic electroluminescent device, the single masking pattern block 200 can be easily formed.

In a large single mask, a total pitch of the slots in a masking pattern can be only adjusted by tension, which is applied from an edge of the large single mask. However, the mask 100 of the present invention comprises a plurality of unit mask elements 100 and 110', and a total pitch thereof can be easily adjusted. In particular, since the unit mask elements 100 and 110' can be independently installed with respect the frame 30, the total pitch can be adjusted by the unit mask elements 100 and 110'.

Figure 9:
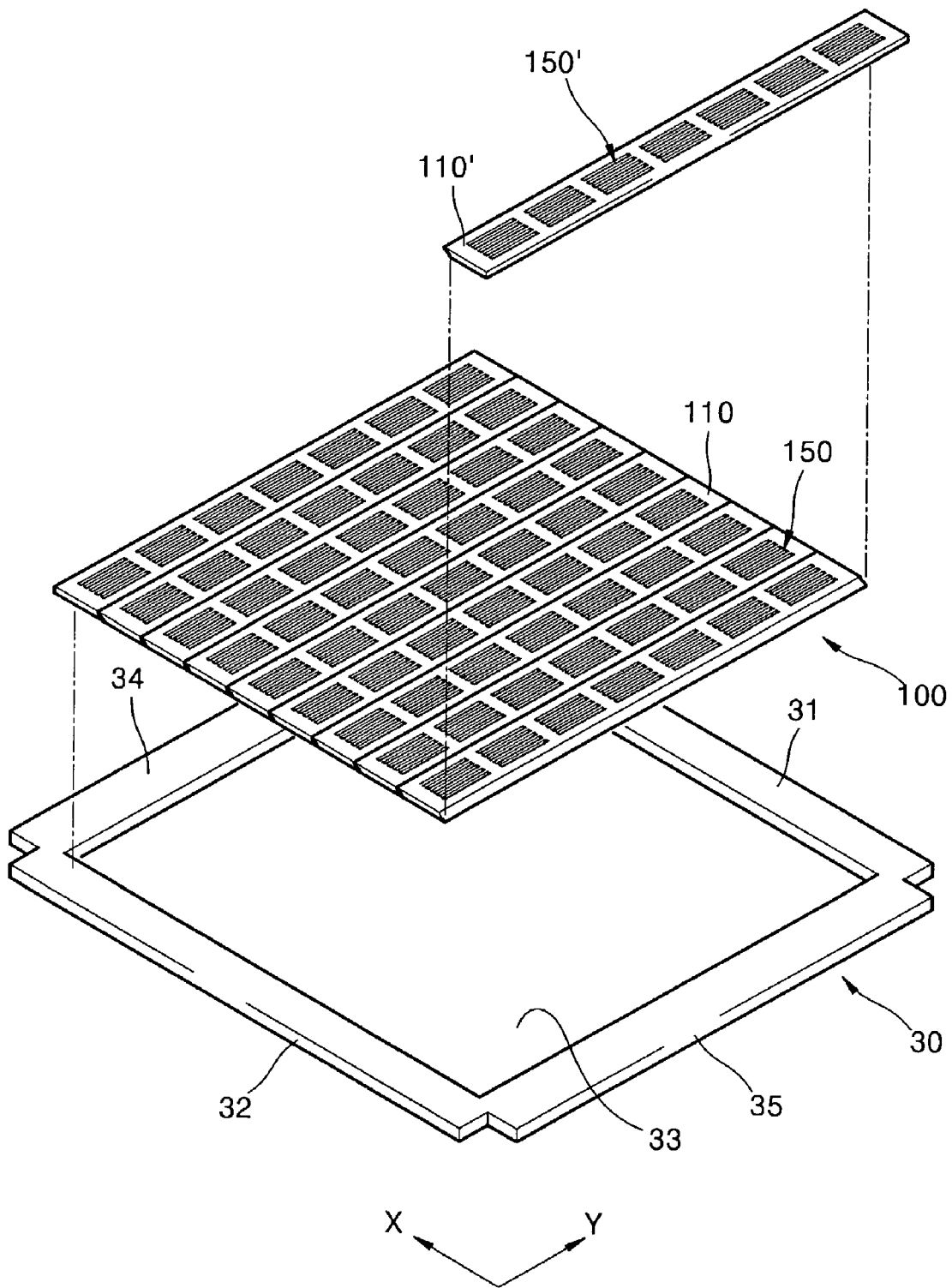
FIG. 9 is an exploded perspective view of a mask frame assembly for a thin layer vacuum evaporation for an organic electroluminescent device according to another embodiment of the present invention.

Although unit masking patterns of unit mask elements have been described as being a single masking pattern block, it is understood that the present invention is not restricted thereto. As shown in FIG. 9, each unit mask element 100 or 110' can include an independent unit masking pattern 150 or 150', and each unit masking pattern 150 or 150' can be used to pattern a separate organic electroluminescent device.

Figure 10:
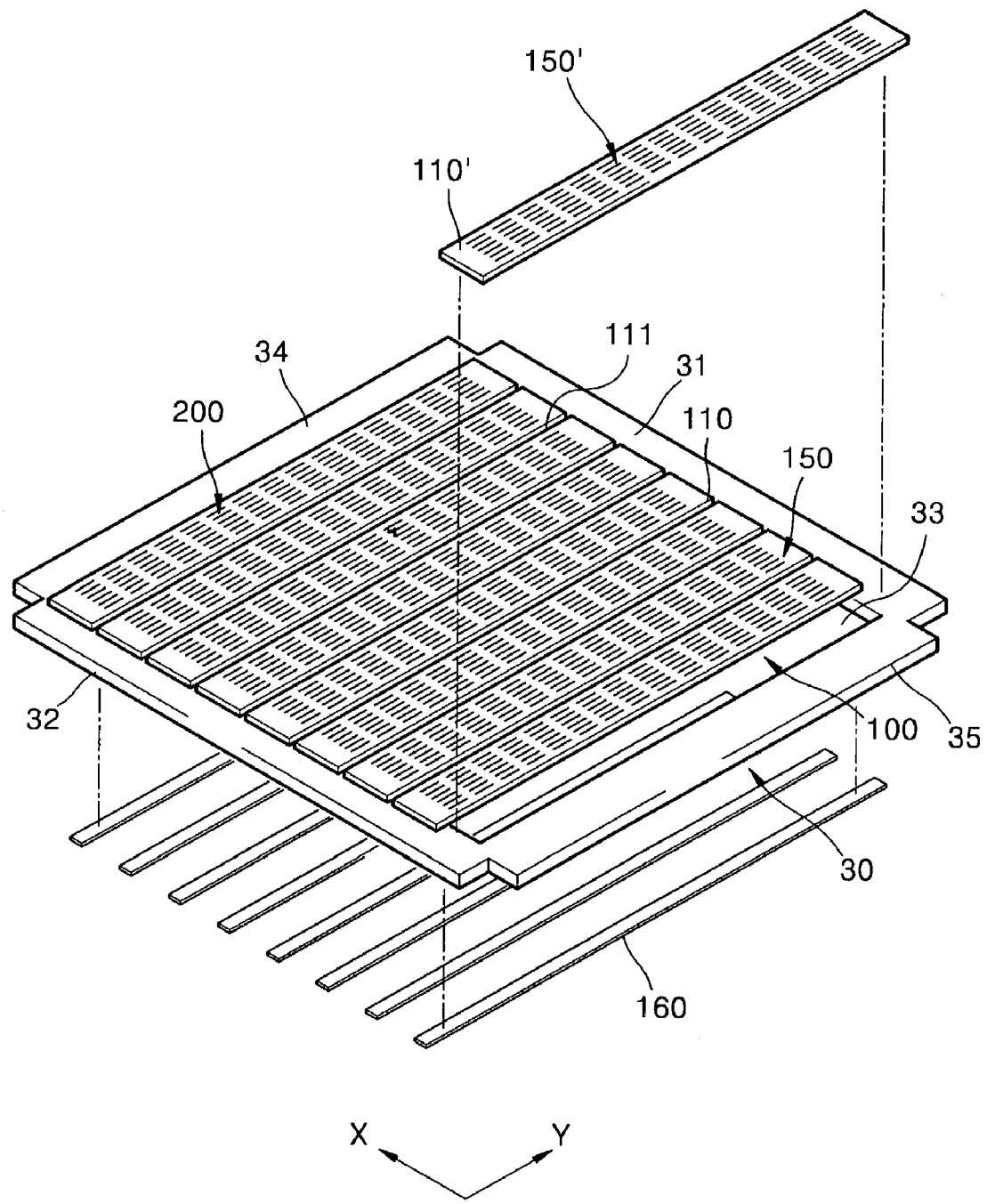
FIG. 10 is an exploded perspective view of a mask frame assembly for a thin layer vacuum evaporation for an organic electroluminescent device according to yet another embodiment of the present invention.

FIG. 10 shows a mask and a mask frame assembly for a thin layer vacuum evaporation for an organic electroluminescent device, according to yet another embodiment of the present invention. Hereinafter, differences between the embodiments shown in FIGS. 4, 9, and 10 will be described.

Figure 11:
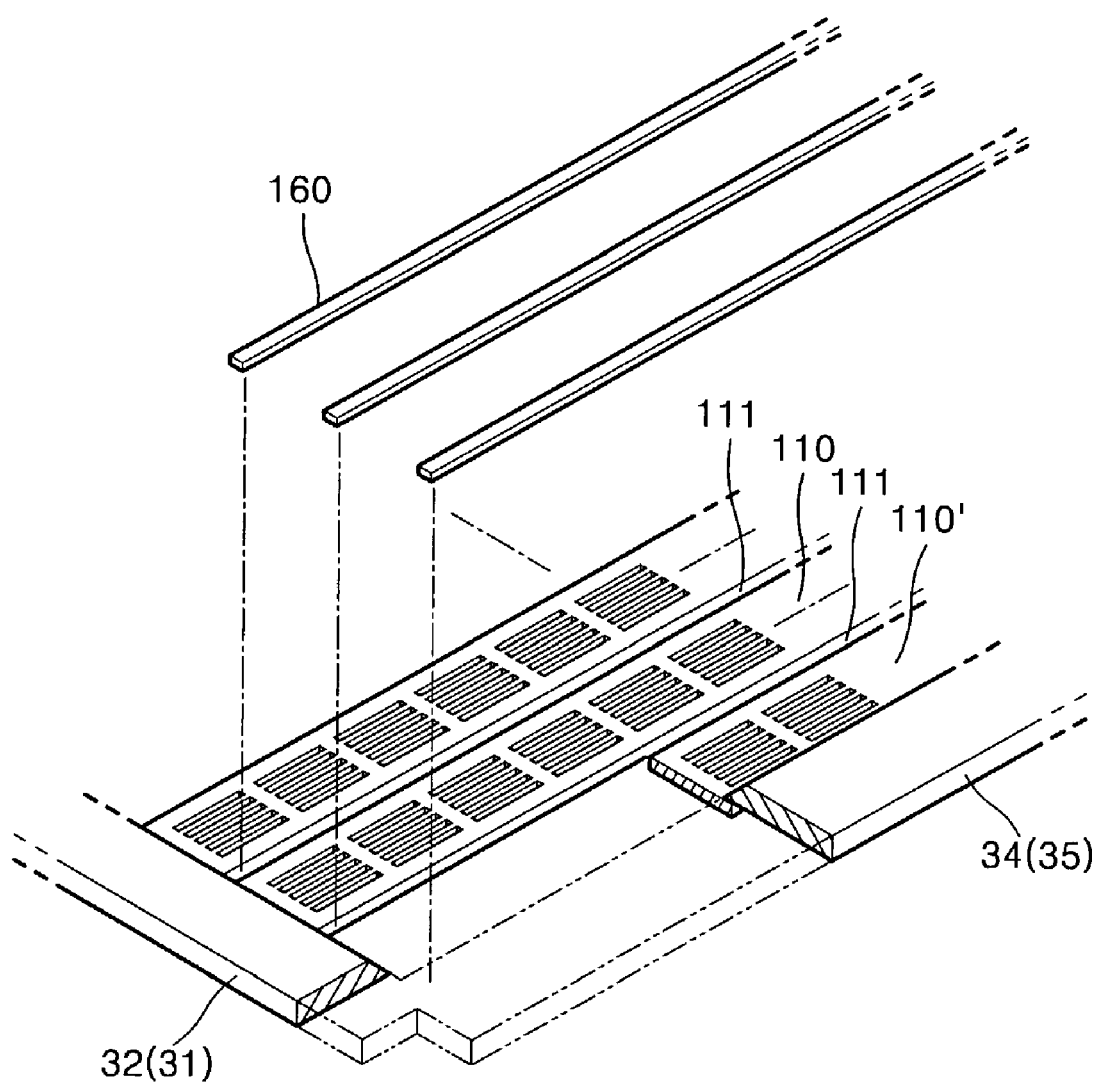
FIG. 11 is a perspective view of a part of the mask frame assembly shown in FIG. 10, a part of which is cut away, and illustrates a bottom of the mask frame assembly.

Unlike in the embodiments shown in FIGS. 4 and 9, in FIG. 10, unit mask elements 100 and 110' do not overlap each other. Rather, they are separated from each other when they are fixed to the frame 30. Accordingly, a gap 111 exists between the unit mask elements 100 and 110', as shown in FIG. 11. This gap 111 is blocked by a sheet element 160.

The sheet element 160 may be made of the same material as the unit mask elements 100 and 110'. A width of the sheet element 160 may be wider than the gap 111 so as to satisfactorily block the gap 111. In addition, the width of the sheet element 160 may be less than a distance, i.e., a pitch, between adjacent unit masking patterns 150 and 150' in adjacent unit mask elements 100 and 110' so as to have the sheet element 160 block the gap 111 without screening slits in the unit masking patterns 150 and 150'.

Figure 12:
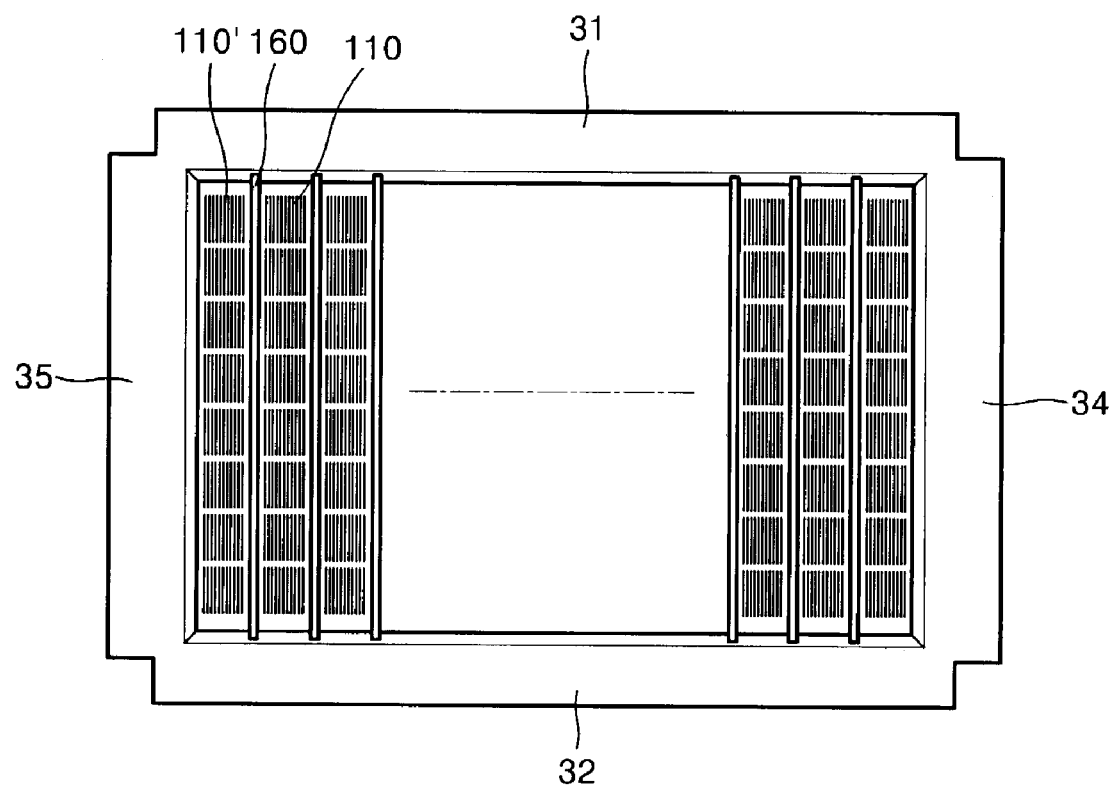
FIG. 12 a bottom view of the mask frame assembly shown in FIG. 10.
Figure 13:
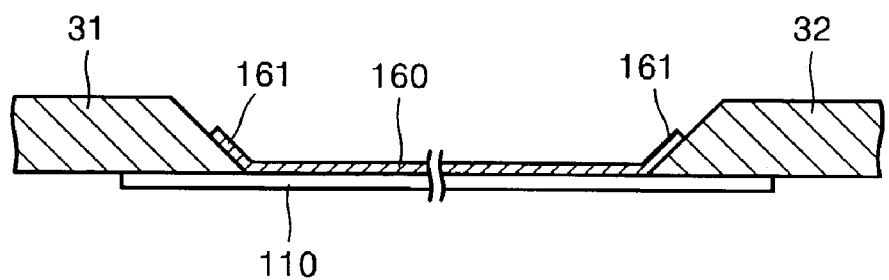
FIG. 13 is a side sectional view of the mask frame assembly shown in FIG. 10.

As shown in FIGS. 11 through 13, both end portions 161 of the sheet element 160 are bonded and fixed to the frame 30 to be parallel with the unit mask elements 100 and 110'. In other words, as shown in FIG. 13, the end portions 161 of the sheet element 160 can be, for example, welded to the first support portions 31 and 32, respectively, using a yag laser welding.

As described above, since the sheet element 160 is bonded to only the frame, the sheet element 160 exerts no influence on the pattern accuracy of the unit mask elements 100 and 110'. In addition, since the gap 111 between the unit mask elements 100 and 110' is blocked by the sheet element 160, evaporation can be prevented from occurring in unnecessary portions, and likewise with that of FIG. 4, a large single making pattern block 200 can be formed, as shown in FIG. 10.

Figure 14:
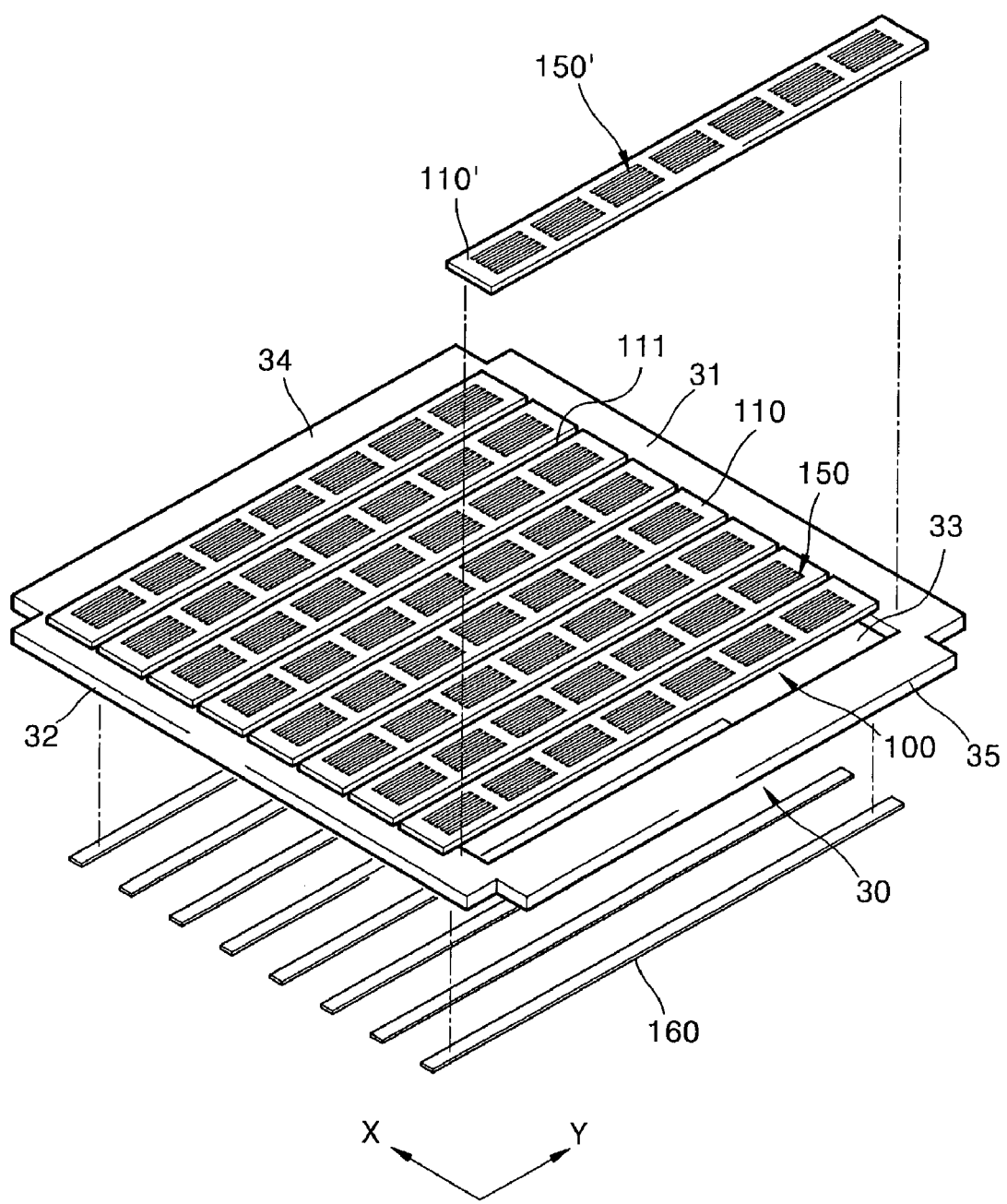
FIG. 14 is an exploded perspective view of a mask frame assembly for a thin layer vacuum evaporation for an organic electroluminescent device according to still another embodiment of the present invention.

In addition, each of the unit mask elements 100 and 110' may be manufactured to form an independent masking pattern block, as shown in FIG. 14.

Figure 15:
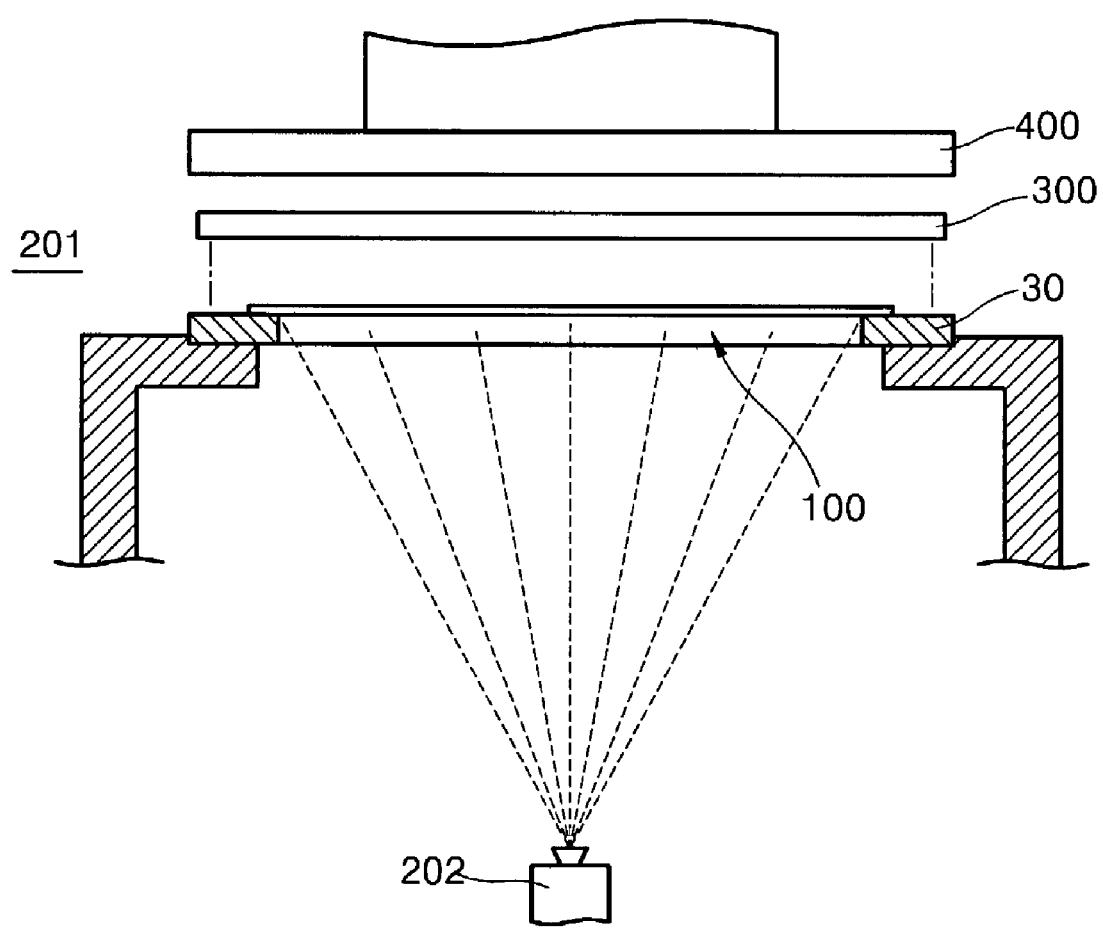
FIG. 15 is a schematic cross-section of an evaporation apparatus for forming an organic layer on a substrate through evaporation.

A mask frame assembly for a thin layer vacuum evaporation for an organic electroluminescent device, according to the present invention, is mounted to an evaporation apparatus shown in FIG. 15 to perform an evaporation operation.

As shown in FIG. 15, to form thin layers, i.e., red, green, and blue organic layers, or cathode layers for organic electroluminescent devices, through evaporation using the mask 100, the mask frame assembly is positioned to face an evaporation crucible 202 installed within a vacuum chamber 201. A substrate 300, on which the thin layers are formed, is mounted on the mask frame assembly. A magnet unit 400 is installed above the substrate 300 so as to attach the mask 100 supported by the frame 30 to the substrate 300.

In a state in which the mask 100 is stuck to the substrate 300 due to an operation of the magnet unit 400, the evaporation crucible 202 is operated so as to evaporate an organic substance or a cathode material contained in the evaporation crucible 202 and deposit the same on the substrate 300. During the evaporation, the mask 100 may be inclined to sag due to its weight and thermally expand. However, since the mask 100 comprises a plurality of unit mask elements 110 and 110', deformation of a part of the mask 100 and distortion of a mask pattern can be prevented. In other words, as shown in FIGS. 4, 9, 10, and 14, since the unit mask elements 110 and 110' have a strip shape and are fixed to the frame 30 with tension acting in a Y direction, the tension is uniformly distributed throughout the mask 100 so as to prevent strain from being concentrated on a particular portion of the mask 100.

As described above, where unit mask elements are fixed to a frame, recessed walls of the unit mask elements overlap each other, or a gap between the unit mask elements is blocked by a sheet element. Accordingly, evaporation can be prevented from occurring at undesired positions, and therefore, a large single masking pattern block can be formed.

In addition, a total pitch can be easily adjusted using the unit mask elements having a plurality of unit masking patterns. Moreover, due to an element that blocks a gap between adjacent unit mask elements, misalignment of the unit mask elements or slits in the mask can be prevented, thereby increasing the pattern accuracy.

As described above, in a mask frame assembly for a thin layer vacuum evaporation for an organic electroluminescent device, according to the present invention, since a mask fixed to a frame is divided into a plurality of unit mask elements, total pitch accuracy and pattern accuracy in a masking pattern block are increased, and pattern distortion due to a thermal deformation is decreased.

Additionally, since the unit mask elements partially overlap each other, or a gap therebetween is blocked by a sheet element, evaporation can be prevented from occurring at undesired positions, and accordingly, a single masking pattern block can be formed. As a result, evaporation for a large display can be accomplished.

Furthermore, since the unit mask elements have a recessed wall at an overlap therebetween, the thickness of the mask is maintained to be uniform. As a result, a large single masking pattern block can be formed without distorting unit mask patterns.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A mask frame assembly for evaporation, comprising: a frame; and
a mask which comprises at least two unit mask elements whose both ends are fixed to the frame, wherein:
the unit mask elements overlap each other by a predetermined distance,
at least one of the unit mask elements includes a unit masking pattern, and
each of the unit mask elements includes a recessed wall in an overlapping portion thereof so as to maintain a constant thickness of the mask at an overlap between the unit mask elements.

2. The mask frame assembly of claim 1, wherein the recessed wall of each unit mask element is formed to have a predetermined width, using a half-etching method, along a lengthwise direction of the each unit mask element.

3. The mask frame assembly of claim 1, wherein the recessed wall is formed to slant, curve or to be stepped.

4. The mask frame assembly of claim 2, wherein the recessed wall is formed to slant, curve or to be stepped.

5. The mask frame assembly of claim 1, wherein the recessed wall has the same width as, or a width greater than that of the overlap between the unit mask elements.

6. The mask frame assembly of claim 5, wherein the width of the recessed wall is in a range of 30–100 $\mu$m.

7. The mask frame assembly of claim 5, wherein the width of the overlap between the unit mask elements is in a range of 10–70 $\mu$m.

8. The mask frame assembly of claim 1, wherein one or more unit masking patterns included in the corresponding one or more unit mask elements form a single masking pattern block.

9. The mask frame assembly of claim 1, wherein the unit masking pattern included in a corresponding one of the unit mask elements forms an independent masking pattern block.

10. A mask frame assembly for evaporation, comprising: a frame; and
a mask which comprises:
at least two unit mask elements whose both ends are fixed to the frame, and
at least one sheet element, wherein:
the unit mask elements are separated from each other by a predetermined gap;
at least one of the unit mask elements includes a unit masking pattern; and
the sheet element blocks the gap between the adjacent unit mask elements.

11. The mask frame assembly of claim 10, wherein the sheet element has both end portions thereof fixed to the frame.

12. The mask frame assembly of claim 10, wherein the sheet element has a width which is greater than the gap between the adjacent unit mask elements and less than a distance between adjacent unit masking patterns respectively included in the adjacent unit mask elements.

13. The mask frame assembly of claim 10, wherein one or more unit masking patterns included in the corresponding one or more unit mask elements form a single masking pattern block.

14. The mask frame assembly of claim 10, wherein the unit masking pattern included in a corresponding one of the unit mask elements forms an independent masking pattern block.

15. The mask frame assembly of claim 1, wherein each of the unit mask elements includes a corresponding unit masking pattern that forms an independent masking pattern block.

16. The mask frame assembly of claim 1, wherein the mask frame assembly is used for a thin layer vacuum evaporation for an organic electroluminescent device.

17. The mask frame assembly of claim 10, wherein each of the unit mask elements includes a corresponding unit masking pattern that forms an independent masking pattern block.

18. A mask for evaporation, comprising:
a first unit mask element having a first recessed wall; and
a second mask element having a second recessed wall that overlaps the first recessed wall so as to maintain a constant surface profile of the mask.

19. The mask of claim 18, wherein the first and second mask elements include one or more unit masking patterns which form a single masking pattern block.

20. The mask of claim 18, wherein one or more unit masking patterns included in each of the first and second unit mask elements form an independent masking pattern block.

21. The mask of claim 18, wherein at least one of the first and second unit mask elements includes a unit masking pattern which forms an independent masking pattern block, or forms a part of a single masking pattern block along with a unit masking pattern corresponding to the other of the first and second unit mask elements.

22. A mask for evaporation, comprising:
at least two unit mask elements; and
at least one sheet element which blocks a gap formed between the adjacent unit mask elements, wherein the mask is divided into the unit mask elements so as to prevent a pattern distortion.

23. The mask of claim 12, wherein:
the unit mask elements comprises first and second mask elements, and
at least one of the first and second unit mask elements includes a unit masking pattern which forms an independent masking pattern block, or forms a part of a single masking pattern block along with a unit masking pattern corresponding to the other of the first and second unit mask elements.

* * * * *